United States Patent [19]
Gouldsberry et al.

[11] Patent Number: 4,634,898
[45] Date of Patent: Jan. 6, 1987

[54] TTL BUFFER CIRCUIT INCORPORATING ACTIVE PULL-DOWN TRANSISTOR

[75] Inventors: Gary Gouldsberry; Albert Chan; Cyrus Tsui; Mark Fitzpatrick, all of San Jose, Calif.

[73] Assignee: Monolithic Memories, Inc., Santa Clara, Calif.

[21] Appl. No.: 554,474

[22] Filed: Nov. 22, 1983

[51] Int. Cl.$^4$ ............... H03K 19/013; H03K 19/088; H03K 17/04; H03K 17/60

[52] U.S. Cl. .................................. 307/456; 307/443; 307/270

[58] Field of Search ............... 307/443, 456, 457, 458, 307/475, 270, 280, 300, 299 A, 555, 558

[56] References Cited

U.S. PATENT DOCUMENTS

| | | | |
|---|---|---|---|
| 3,602,735 | 8/1971 | Lodi | 307/456 |
| 4,330,723 | 5/1982 | Griffith | 307/456 |
| 4,339,675 | 7/1982 | Ramsey | 307/456 X |
| 4,347,446 | 8/1982 | Price | 307/443 |
| 4,349,751 | 9/1982 | Hartman et al. | 307/252 A |
| 4,449,063 | 5/1984 | Ohmichi et al. | 307/456 |
| 4,458,162 | 7/1984 | Solomon et al. | 307/456 |

OTHER PUBLICATIONS

A. W. Chang, IBM Technical Disclosure Bulletin, vol. 20, No. 2, Jul., 1977, pp. 601-603.

Primary Examiner—Stanley D. Miller
Assistant Examiner—David Roy Bertelson
Attorney, Agent, or Firm—Steven F. Caserza; Alan H. MacPherson; Kenneth E. Leeds

[57] ABSTRACT

A unique double inversion buffer has a first means to invert and isolate the digital input signal, a second means to reinvert and further isolate the input signal, and an output means including an output transistor 94. The double inversion buffer is configured with active pull-down means on the output transistor 92. The high-to-low propagation delay time and the low-to-high propagation delay times through the double inversion buffer and reduced by use of the active pull-down means. Rapid turnoff of the output transistor is accomplished by coupling a transistor to its base to instantaneously turn it off. In a preferred embodiment, a clamping circuit 201 is used to hold the output voltage at a maximum predetermined level to further reduce the time it takes to reduce the output voltage to the logical "0" state.

6 Claims, 9 Drawing Figures

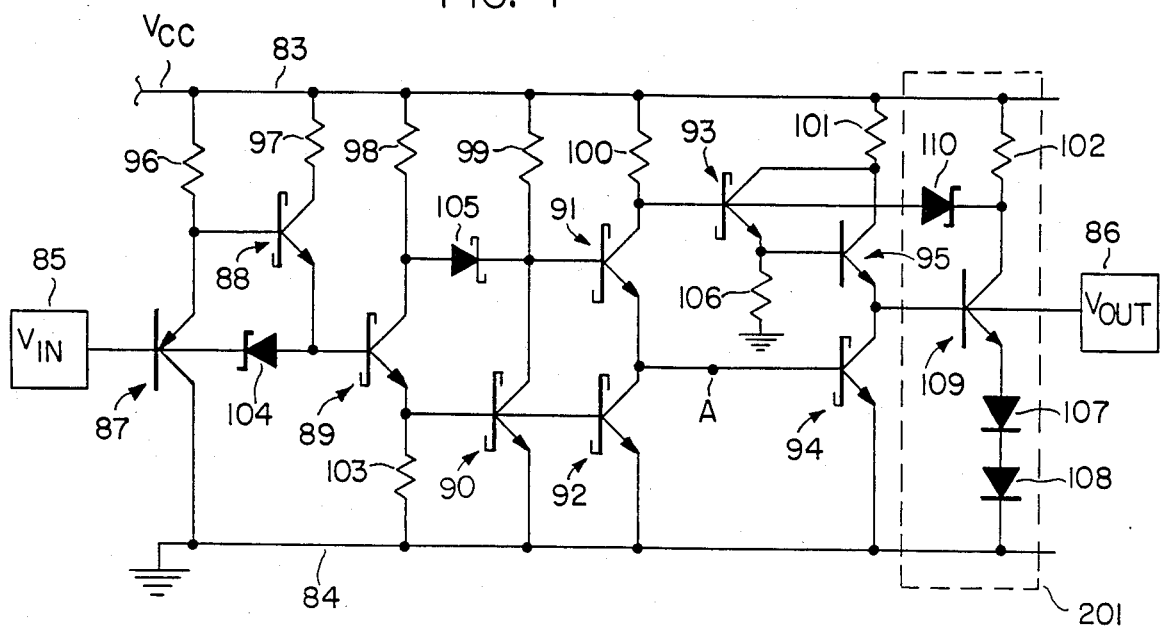
FIG. 4
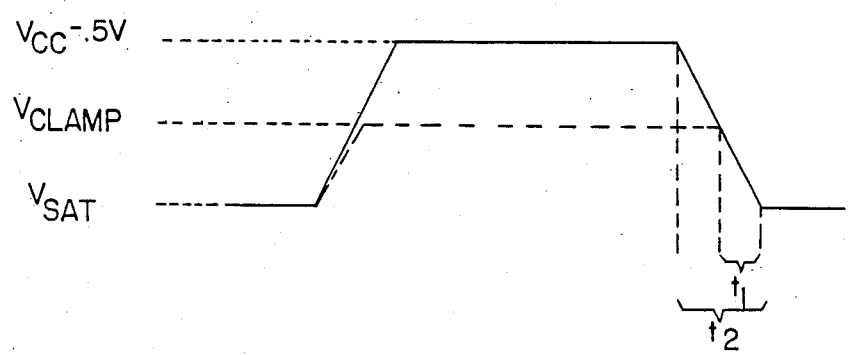

TTL BUFFER CIRCUIT INCORPORATING ACTIVE PULL-DOWN TRANSISTOR

BACKGROUND OF THE INVENTION

1. Field of the Invention

This invention relates to a double inversion buffer for use in integrated circuits and, more particularly, relates to a double inversion buffer having a short low-to-high propagation delay which is obtained by using an active pull-down means.

2. Description of the Prior Art

Buffers are employed on almost all integrated circuits. They serve to isolate the circuit from external noise and ensure that voltage levels for the digital inputs are consistent and meet the internal requirements of the circuit. In order to transfer the correct digital data from external sources to the circuitry within an integrated circuit, double inversion buffers are typically employed. Thus, the digital data is inverted once thereby creating the inverse data and is then inverted a second time to restore the signal to the original digital data at a specified, stable voltage level. Preferably, to provide a good low voltage, a sinking current is employed to insure that charge is removed from a given node, thereby actively pulling the node low quickly. Conversely, to produce a good high voltage, current is typically provided (or "sourced") thereby to insure that ample current is provided on a given node to produce a high voltage.

Conventional double inversion buffers employ a first circuit means to produce an inversion of the digital input, a second inversion means to restore the state of the original input, and output means which includes both a pull-up means and a pull-down means to provide the requisite high or low outputs as dictated by the twice inverted representations of the digital input signal. Various prior art examples of double inversion buffers are shown in FIGS. 1-3. The operation of these examples is discussed in detail subsequently. These conventional circuits possess significant propagation delay times. For high-speed integrated circuits it is desirable to minimize the double inversion propagation delay time. The limiting factor in reducing the low-to-high propagation delay time, TPLH, is known to be the time that it takes to turn off the transistor which pulls down the output node. This is akin to regeneration which must necessarily be accomplished before the next digital input can be accepted and inverted twice.

It is therefore an object of the present invention to provide a double inversion buffer which has a low propagation delay time.

It is another object of the present invention to provide a double inversion buffer circuit which has a fast pull-down time for the output transistor.

It is an additional object of the present invention to provide a double inversion buffer which utilizes active means to pull down the output transistor.

SUMMARY

A unique double inversion buffer has a first means to invert and isolate the digital input signal, a second means to reinvert and further isolate the input signal, and an output means including an output transistor. The double inversion buffer is configured with active pull-down means on the output transistor. The high-to-low propagation delay time and the low-to-high propagation delay times through the double inversion buffer are reduced by use of the active pull-down means. Rapid turnoff of the output transistor is accomplished by coupling a transistor to its base to instantaneously turn it off. In a preferred embodiment, a clamping circuit is used to hold the output voltage at a maximum predetermined level to further reduce the time it takes to reduce the output voltage to logical "0" state.

BRIEF DESCRIPTION OF THE DRAWINGS

For a more complete understanding of the present invention, reference may be made to the accompanying drawings which are incorporated herein by reference and in which:

FIG. 4 is a schematic diagram of the double inversion buffer of the present invention which employs an active means for turning off the pull-down transistor;

FIGS. 5a–5d are voltage levels of the input terminal 85, the collector voltage of transistor 89, the collector voltage of transistor 91, and the output voltage of the double inversion buffer of FIG. 4; and FIG. 6 is a voltage diagram illustrating the voltage on the output transistor 94 and clamping transistor 109 of the double inversion buffer of FIG. 4.

DETAILED DESCRIPTION

Figure 1:
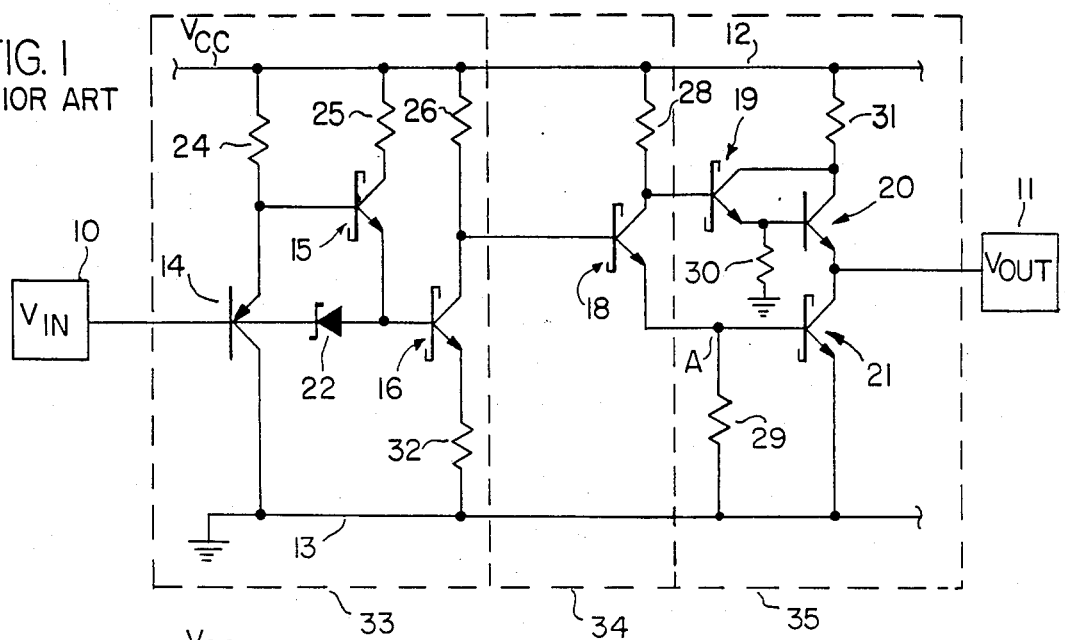
FIG. 1 is a schematic diagram of a double inversion buffer of the prior art employing passive pull-down means.

A conventional double inversion buffer of the prior art is shown in FIG. 1. In circuit terms it comprises a first means to invert the digital input signal $V_{in}$ applied to input terminal 10, a second means to reinvert and further isolate the input signal, and an output stage to adjust the level of the double inverted signal to the level required by external circuitry (not shown) which can, if desired, be contained within the same integrated circuit. This first means is shown within dotted line 33 and consists of transistors 14, 15 and 16, bias resistors 24, 25, 26 and 32 and guard ring Schottky diode 22. (A guard ring Schottky diode is a Schottky diode having an increased reverse breakdown voltage of approximately 28–30 volts provided by using an additional fabrication step.) The signal on the collector of transistor 16, as described subsequently, is the inverted and electrically isolated representation of the digital input signal, $V_{IN}$. The second means is shown within dotted line 34 and includes transistor 18 and bias resistor 28. As described subsequently, the output signal on the collector of transistor 18 is the reinverted repesentation of the digital input signal, $V_{IN}$. The output stage is shown within the dotted line 35 and consists of Darlington pair 19, 20, output transistor 21, passive pull-down resistor 29 and resistors 30 and 31. The output stage 35 takes the reinverted signal from the second means 34 and generates a suitable output signal $V_{OUT}$ on output terminal 11.

The key to regeneration of the double inversion buffer is to pull down node A fast to provide a fast low to high propagation delay, and to pull up node A fast to provide a fast high to low propagation delay. Resistor 29 discharges the stored charge on the base of output transistor 21 as well as the Miller capacitance between the base and collector. The discharge time is determined by the RC time constant of the base-to-collector capacitance of transistor 21 and the resistor 29. In theory, turnoff time would be short if the resistance of resistor 29 was zero. However, this cannot be done because in that case, the base of the output transistor 21 would be grounded, and output transistor could never be turned on. The use of resistor 29 to pull down node A is undesirable because the effective value of resistor 29 may vary by as much as 20% across the military temperature range and cannot be specified with accuracy from wafer to wafer and across a given wafer in standard semiconductor processes.

The operation of the conventional double inversion buffer circuit of FIG. 1 is as follows. Typically, a double inversion buffer circuit is designed to accept an input signal $V_{IN}$ on input terminal 10 which is either greater than a minimum threshold to signify a digital "1" or less than a specified maximum to signify a digital "0"; for standard transistor-transistor logic (TTL) devices, a digital "1" is signified by a voltage greater than 2.0 volts while a digital "0" is signified by a voltage less than 0.8 volts. By reference to Table 1 below, it can be seen that when a logical "1" input signal is applied to input terminal 10, transistor 14 is turned off, transistor 15 is turned on, and so on, in accordance with the information in Table 1. The first inversion is accomplished by means of the transistors 14, 15 and 16. The inverted and isolated representation of the input voltage appears on the collector of transistor 16. The second inversion is accomplished by means of transistor 18 with the double inverted voltage appearing on the collector of transistor 18. This double inverted voltage is communicated and further isolated by transistor 19 to the output terminal 11 connected to the emitter of transistor 20. Once the output signal $V_{OUT}$ on terminal 11 achieves the same logical state as $V_{IN}$ on input terminal 10 for a finite minimum time defined by the specifications of the circuit and the requirements of external circuitry (not shown), the double inversion buffer may be regenerated.

Regeneration is accomplished by the pull-down transistor 21 which must turn on to dissipate the charge on the output terminal 11. The output signal $V_{OUT}$ will be held on terminal 11 so long as the digital input signal $V_{IN}$ is not altered from the original signal level. Regenerating the buffer and initiation of the change of state of the buffer is accomplished, for example, by the application of a logical "0" to input terminal 10. When this occurs the transistor 14 will be turned on and transistor 15, 16 and 17 will turn off in accordance with the second column in Table 1 above. A finite time on the order of one to several nanoseconds is required to discharge node A through resistor 29 to ground line 13. This finite time determines the speed of operation of the buffer, i.e., the number of buffered double inverted operations that can be performed in a given period of time.

Figure 2:
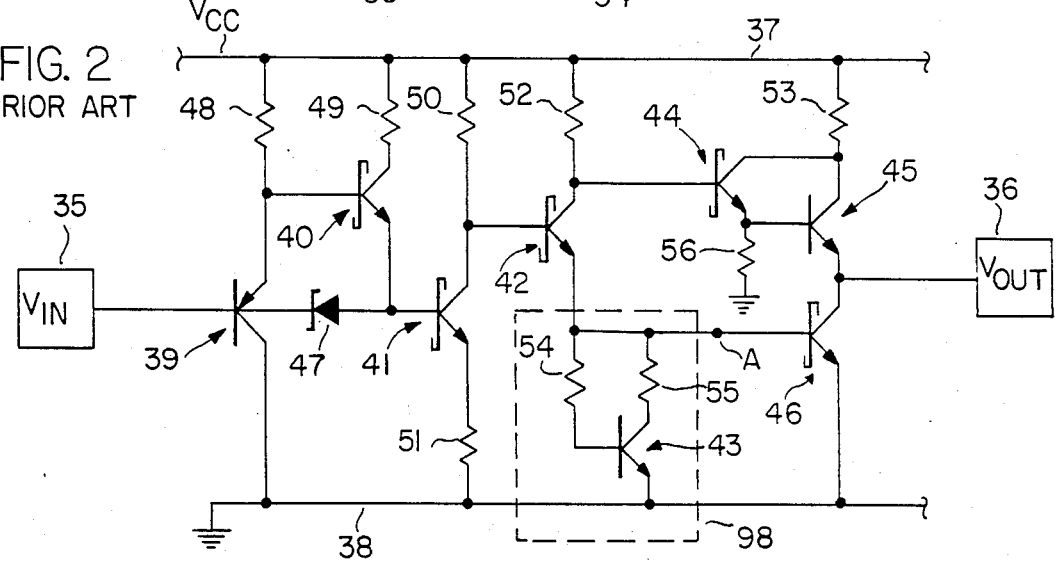
FIG. 2 is a schematic diagram of a prior art double inversion buffer employing a squaring circuit for providing square shoulder characteristics for the low to high transistion of the output transistor.

In the prior art double inversion buffer shown in FIG. 2, in order to square the shoulders of the output voltage on terminal 36 as it rises from a logical "0" to a logical "1", a squaring circuit 98 is employed. The double inversion buffer portion of the circuit operates essentially as previously described with respect to the prior art circuit of FIG. 1. However, in the prior art embodiment of FIG. 2, node A is discharged through resistor 55 and transistor 43 to ground line 38. The resistor 54 has one end connected to node A, the emitter of transistor 42, and the other end connected to the base of transistor 43. Resistor 54 is thus connected between node A and the base of transistor 43. The squaring circuit 98 operates as follows. When transistors 42 and 46 are on, e.g., when a logical "0" is applied to input terminal 35 and a logical "0" is thus generated on output terminal 36, transistor 43 is also on. Transistor 43 is designed to be a non-Schottky transistor which will saturate. When transistor 18 turns off, e.g., when a logical "1" is applied to input terminal 35 and a logical "1" is thus generated on output terminal 36, transistor 43 will take a finite period of time to come out of the saturation state. Transistor 43 will continue to conduct collector current through resistor 55. Since transistor 42 is now off, the current through the collector of transistor 43 is provided by the stored charge on node A. Eventually, however, transistor 43 turns off and the discharge of the node A slows and eventually stops. If the values of resistors 54 and 55 and the geometry of transistor 43 have been correctly chosen, transistor 46 will have had its base totally discharged before transistor 43 turns off. However, when one designs the squaring circuit 98 such that the turn-off time of transistor 46 is decreased, the turn-on time of transistor 46 is increased, and vice versa. Thus, a compromise is chosen which prevents transistor 43 from optimally discharging node A. Thus there is a finite low-to-high propagation delay for turning off transistor 46.

Figure 3:
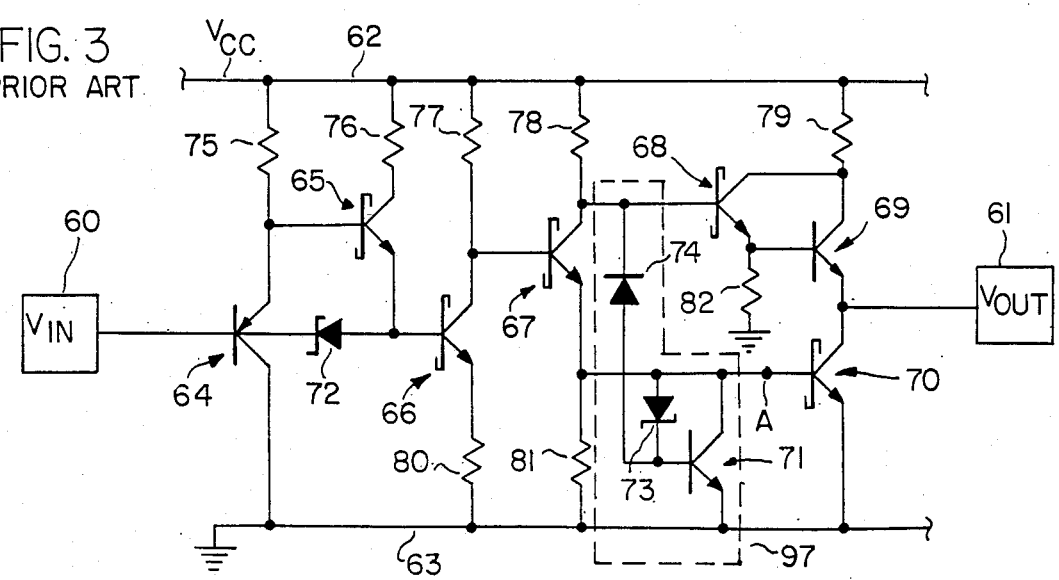
FIG. 3 is a schematic diagram of a prior art double inversion buffer employing means to discharge the Miller capacitance on the output transistor.

In an additional embodiment of the prior art shown in FIG. 3, a double inversion buffer is provided which includes a capacitive discharge subcircuit 97 which is especially designed to discharge the Miller capacitance between the base and collector of pull-down transistor 70. The operation of the double inversion buffer portion of FIG. 3 follows the description for the circuit of FIG. 1. The discharge of the charge on node A and of the Miller capacitance charge is accomplished by the operation of diodes 74, 73 and transistor 71 in conjunction with resistor 81. The discharge occurs as follows. When transistor 67 turns off, e.g., when a logical "1" is applied to input terminal 60 and a logical "0" is generated on the collector of transistor 66, the voltage on the collector of transistor 67 increases. The voltage on the base of transistor 71 rises because of the capacitive coupling of a very large diode 74. As a result, transistor 71 turns on, thereby providing a low impedance path from node A to ground 63. However, transistor 71 will turn off before the node A is completely discharged, so the remaining charge on node A is dissipated to ground line 63 through resistor 81. The diode 73 is provided to ensure that the operation of the capacitive discharge subcircuit 97 will continue under high-speed switching conditions. Diode 73 prevents the base of transistor 71 from being at a potential less than ground. Without diode 73, the base of transistor 71 could be at a voltage less than ground when transistor 67 turns on, and its collector voltage drops, because the base of transistor 71 is capacitively coupled to the collector of transistor 67, thereby decreasing the voltage on the base of transistor 71 by an amount equal to the decrease in voltage on the collector of transistor 67. The use of diode 73 prevents this from occurring. However, at best, the low-to-high propagation delay has a finite value as a result of the combination of the low-impedance path through transistor 71 followed by the passive discharge through resistor 81.

The double inversion buffer of the present invention, one embodiment of which is shown in FIG. 4, permits a minimum low-to-high propagation delay to be achieved by employing a transistor 92 to completely pull down the charge stored on node A. This constitutes an active pull-down technique. The circuit of the embodiment of the present invention shown in FIG. 4 operates as follows. The double inversion portion of the circuit operates essentially as described previously with respect to FIG. 1. The discharge transistor 92 turns on as soon as transistor 89 is turned on and the voltage across resistor 103 reaches the requisite base-to-emitter voltage for transistor 92. All other methods, even circuits employing transistors, require transistor 91 to turn off before transistor 94 could turn off. With the present invention, the turn off of transistor 94 is independent of the operation of transistor 91. Also, the present invention discharges node A faster since transistor 92 is driven by transistor 89 which is operated independent of transistor 94 or transistor 91. This means that the discharge transistor 92 will stay on during the entire period required to effect the discharge. As described previously with respect to prior art embodiments, the employment of means to turn off the pull-down transistor was always limited by collateral constraints.

As shown in Table 2 when a logical "0" is applied to input terminal 85 and thus there is to be a logical "0" on output terminal 86, transistor 91 turns on and transistor 94 turns on, and transistors 90 and 92 are turned off. Therefore, the discharge transistor 92 sinks no current, i.e., it is an infinite impedance between its collector, connected to node A, and its emitter, connected to ground 84. Conversely, when a logical "1" is applied to input terminal 85 and thus there is to be a logical "1" on output terminal 86, transistor 94 turns off, transistor 89 has turned on, which in turn turns on transistors 90 and 92. Discharge transistor 92 therefore appears as a nearly zero impedance and remains in this state until transistor 89 again turns off in response to a logical "0" applied to input terminal 85.

The voltage on the emitter of transistor 95 appears as the output voltage $V_{out}$ on output terminal 86. However, in accordance with one embodiment of the present invention, as shown in FIG. 4, clamping circuitry 201 is provided which limits the voltage level appearing on output terminal 86 to only a fraction of the level to which the voltage on output terminal 86 would otherwise rise. The clamping circuitry 201 includes transistor 109 whose emitter is connected through diode string 107, 108 to ground line 84, whose base is connected to the emitter of output transistor 95 and to the collector of pull-down transistor 94, and whose collector is connected through resistor 102 to the voltage supply $V_{CC}$ and through Schottky diode 110 to the base of Schottky transistor 93. The clamping circuit 201 serves to limit the output voltage, $V_{OUT}$ which appears on output terminal 86. As seen in the solid line of FIG. 6, the voltage which would appear on terminal 86 would, for a logical "0", rise from the level of $V_{sat}$ (the collector-emitter voltage of transistor 94 when transistor 94 is saturated) to $V_{cc}$ minus a small (typically 0.5 volts) offset voltage. The time required for the rise to the level for a logical "1" or the drop to a level for a logical "0" limits the speed of the circuit. With no clamping, the time, for example, for a change from a logical "1" to a logical "0" is designated as $t_2$. With the clamping circuit the voltage rise is limited to the clamped level $V_{clamp}$ shown by the dotted line. This level necessarily is of a magnitude sufficient for use in the external circuitry. However, it only requires the transistion time $t_1$ to fall from the state of a logical "1" to a logical "0". The clamp circuit operates as follows. When output terminal 86 goes high (i.e., a logical "1"), a high voltage is applied to the base of clamping transistor 109, clamping transistor 109 turns on, forward biasing diodes 107, 108 and thus causing current to flow from $V_{cc}$ lead 83, through resistor 102, through transistor 109, diodes 107, 108, to ground lead 84. Thus output terminal 86 is held to a voltage equal to the base-emitter voltage of clamping transistor 109 (typically 0.8 volts), plus the voltage across forward biased diodes 107 and 108 (typically 0.8 volts each), thus, the logical "1" output voltage is typically changed to a value of 2.4 volts.

The relationship between the state of transistor 94 and the low-to-high propagation time is shown in FIGS. 5a–5d. Initiation of a transistion on output terminal 86 from a logical "0" to a logical "1" occurs by the application of a logical "1" input signal $V_{in}$ on input terminal 85 which previously had received a logical "0". This is shown at the left-hand side of FIG. 5a. When a high voltage $V_{IN}$ is applied to input terminal 85, a smooth low-to-high transition occurs which takes a small but finite time. With a short delay, the transistor 89 turns on, thereby lowering the voltage on its collector as current flows through resistor 98 from voltage supply line 83 and to ground line 84 through resistor 103. This transistion of the collector voltage $V_{c89}$ is shown in FIG. 5b. Then, as the voltage on the base of transistor 91 goes low in response to the decrease in collector voltage $V_{c89}$, transistor 91 turns off, thereby causing the voltage $V_{c91}$ on the collector of transistor 91 to rise as shown in FIG. 5c. Finally, after a finite delay time, the output voltage $V_{OUT}$ rises to the level determined by the voltage supply line 83 as adjusted by the clamping circuitry since transistor 95 will conduct and transistor 94 is turned off. The total low to high propagation time TPLH is the sum of these three internal delays which are inherent in the circuit. A transition from a logical "1" to a logical "0", however, requires the discharging of node A which is accomplished as described above in accordance with the embodiment of the present invention depicted in FIG. 4. Since the inherent delays of the circuit cannot be eliminated, it is the time required to regenerate (i.e., discharge) node A that holds the key to optimizing the transistion delay from a logical "1" to a logical "0" of the double inversion buffer constructed in accordance with the present invention. The time it takes to turn off pull-down transistor 94, in turn, is the key in determining the time it takes to regenerate the circuit by discharging node A.

The specific embodiments of this invention described in this specification are intended to serve by way of example and are not a limitation on the scope of my invention. Numerous other embodiments of this invention will become apparent to those of ordinary skill in the art in light of the teachings of this specification.

TABLE 1

| Transistor | Logical "1" | Logical "0" |
| --- | --- | --- |
| 14 | off | on |
| 15 | on | off |
| 16 | on | off |
| 17 | on | off |
| 18 | off | on |
| 19 | on | off |
| 20 | on | off |
| 21 | off | on |

TABLE 2

| Transistor | Logical "1" | Logical "0" |
|---|---|---|
| 87 | off | on |
| 88 | on | off |
| 89 | on | off |
| 90 | on | off |
| 91 | off | on |
| 93 | on | off |
| 94 | off | on |
| 95 | on | off |
| 109 | on | off |
| 92 | on | off |

We claim:

1. In a double inversion buffer incorporating a first circuit means to invert a digital input signal, a second circuit means to produce re-inversion of said digital input signal, and output stage means for receiving said twice inverted signal and providing an external output signal, including an output line, pull-up means and a pull-down transistor connected between said output line and ground, the improvement comprising:
a transistor connected between the base of said pull-down transistor and ground to fully discharge said pull-down transistor in response to the operation of said first circuit means.

2. An improved double inversion buffer in accordance with claim 1 in combination with clamping circuit means connected to the output of said output stage to limit the output voltage level of said double inversion buffer to thereby decrease the low-to-high and high-to-low transition times of said signal on said output line.

3. An improved double inversion buffer in accordance with claim 1 wherein:
said first circuit means comprises a first transistor whose base is connected to the input terminal of said double inversion buffer, whose emitter is connected through a resistor to a voltage supply line and whose collector is connected to ground, diode means connected between the base of said first transistor and the base of a second transistor, the collector of said second transistor being connected through a resistor to said voltage supply line, and a third transistor whose emitter is coupled to the base of said second transistor, whose base is connected to the emitter of said first transistor, and whose collector is connected through a resistor to said voltage supply line, the collector of said second transistor producing a signal which is an inverted representation of said digital input signal;
said second circuit means comprises a fourth transistor whose base is connected to the emitter of said second transistor, whose collector is connected through a resistor to said voltage supply line, and through a diode to the collector of said second transistor, whose emitter is connected to ground, a fifth transistor whose base is coupled to the collector of said fourth transistor, whose collector is connected through a resistor to said voltage supply line and whose emitter is connected to the base of said pull-down transistor, and a sixth transistor whose base is connected to the collector of said fifth transistor, whose emitter is connected through a resistor to ground and whose collector is connected through a resistor to said voltage supply line; and
said pull-up means comprises a pull-up transistor whose collector is cnnected through a resistor to said voltage supply line, whose base is connected to the emitter of said sixth transistor and whose emitter is connected to said output line;
said pull-down transistor has its collector connected to said output line, and its emitter connected to ground; and
said transistor means comprises a Schottky transistor whose collector is coupled to the emitter of said fifth transistor and to the base of said pull-down transistor, whose base is connected to the emitter of said second transistor, and whose emitter is connected to ground.

4. An improved double inversion buffer in accordance with claim 3 in combination with a clamping circuit connected to said output stage for limiting the voltage levels on said output and reducing the state transistion times.

5. An improved double inversion buffer in accordance with claim 4 where said clamping circuit comprises:
a seventh transistor whose base is connected to the emitter of said pull-up transistor, whose emitter is connected through a diode string to ground, and whose collector is connected through a resistor to the voltage supply line and through a Schottky diode to the base of said sixth transistor.

6. An improved double inversion buffer in accordance with claim 5 wherein said diode string comprises series connected diodes having their anode side connected to the emitter of said seventh transistor.

* * * * *